US006894563B1

United States Patent
Si

(10) Patent No.: US 6,894,563 B1
(45) Date of Patent: May 17, 2005

(54) AUTOMATIC CONTROL OF AMPLIFIER GAIN USING DEGENERATION

(75) Inventor: Weimin Si, San Jose, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/422,263

(22) Filed: Apr. 24, 2003

(51) Int. Cl.⁷ .............................. H03F 3/45; H03G 3/12
(52) U.S. Cl. ...................................... 330/254; 330/283
(58) Field of Search ................................ 330/254, 283

(56) References Cited

U.S. PATENT DOCUMENTS

| | | | | |
|---|---|---|---|---|
| 4,378,528 A | * | 3/1983 | Harford | 330/254 |
| 5,726,604 A | * | 3/1998 | Onetti et al. | 330/283 |
| 5,880,631 A | * | 3/1999 | Sahota | 330/51 |
| 6,031,424 A | * | 2/2000 | Fairgrieve | 330/260 |
| 6,529,077 B1 | * | 3/2003 | Dasgupta | 330/254 |

OTHER PUBLICATIONS

Loinaz, Marc J. and Wooley, Bruce A., *A CMOS Multichannel IC for Pulse Timing Measurements with 1–mV Sensitivity*, IEEE Journal of Solid–State Circuits, vol. 30, No. 12, Dec. 1995.

* cited by examiner

*Primary Examiner*—Patricia Nguyen
(74) *Attorney, Agent, or Firm*—Reed Smith LLP; John W. Carpenter

(57) ABSTRACT

A technique for automatically controlling the gain of an amplifier by using a transistor as a voltage controlled variable degeneration resistor. The apparatus and method may be advantageously adapted for use in either voltage-to-current amplifiers or voltage-to-voltage amplifiers, single-ended or differential designs. One benefit of this technique is that, since the bias current is constant, the transistors operate in the correct region (i.e. the transistors are not biased out of the operating region). Additionally, the control mechanism is well-bounded.

18 Claims, 3 Drawing Sheets

AUTOMATIC CONTROL OF AMPLIFIER GAIN USING DEGENERATION

BACKGROUND OF THE INVENTION

1. Field of the Invention

The present invention relates generally to the field of electronic circuits, and more particularly to an apparatus and method for automatic control of amplifier gain using degeneration.

2. Description of the Related Art

In the integrated circuit designs, due to manufacturing process variations and the sensitivity of device parameters to temperature and supply voltage, the gain of amplifier stages is not well controlled. The variation of gain, or transconductance, of the amplifiers may be as high as a factor of 2 or more, especially when using a CMOS process. This large gain variation imposes difficulties for both circuit and system design in many applications.

Previously, this problem has been addressed by sensing the gain of the amplifier and using various feedback schemes to adjust the biasing current of the gain stage to minimize the variation in each amplifier. See for example, the article by Loinaz, published in the IEEE Journal of Solid State Electronics, December 1995, pgs. 1339–1349. By adjusting the biasing current for each amplifier, the gain may be normalized across each part.

In order to try to keep the gain constant across process and temperature variations, however, the biasing current will vary across a very wide range. This is especially true in deep sub-micron CMOS processes. Due to the velocity saturation, changes in the biasing current will not have enough impact on the gain. This may result in the biasing current moving from one limit to the other, causing the amplifier circuit to go out of the linear region or even not working.

Another approach to this problem has been to use a closed-loop feedback amplifier to reduce the gain variation. Closed loop feedback amplifiers have many drawbacks, however, and cannot be used in certain applications. A big problem is that these circuits are slow, so they cannot be used for high-speed applications, such as RF gain stages. Additionally, for high-speed applications such as RF gain stages, closed loop amplifiers are potentially unstable.

Thus, there is a need from an improved technique to control amplifier gain across temperature and process variations.

SUMMARY OF THE INVENTION

In general, the present invention is a technique for automatically controlling the gain of an amplifier by using a transistor as a voltage controlled variable resistor to degenerate the amplifier gain, so that the gain of amplifier is predetermined, regardless of process and temperature variation. To realize the automatic control, a replica gain stage is used to provide the control voltage for the main amplifier. The gain adjustment circuit comprises a replica of the real gain stage, a gain measurement circuit and a feedback amplifier. The DC gain of a replica gain stage is measured and compared with a preset gain value. The difference is amplified and used to adjust the gain of the amplifier in the opposite direction through the voltage controlled degeneration resistor. Through this technique, the amplifier gain can be controlled to be a preset gain value, regardless of process and temperature variation.

In one embodiment, the present technique is applied to an amplifier circuit having a voltage-to-current gain, also known as transconductance. The amplifier circuit may comprise a first amplifier circuit having a first predetermined reference voltage applied to the amplifier, the amplifier circuit having at least one MOS transistor configured as a voltage controlled variable degeneration resistor, a reference current source connected to a control node, a converter circuit having an output connected to the control node and an input connected to the first amplifier circuit, wherein the converter circuit detects an operational current produced by the amplifier in response to the first predetermined reference voltage; and outputs an adjustment current, based on the operational current, to the control node, a second amplifier circuit connected as a replica of the first amplifier, the second amplifier circuit having at least one MOS transistor configured as a voltage controlled variable degeneration resistor, wherein a control voltage at the control node, set by the reference current and the adjustment current, is applied to a gate of the at least one MOS transistors in the first and second amplifier circuits to adjust the transconductance of the amplifiers.

A voltage-to-voltage amplifier may also be configured to utilize the teachings of the present invention. A voltage-to-voltage amplifier circuit with automatic gain adjustment according to the present invention may comprise a first amplifier circuit having a first predetermined reference voltage applied to the amplifier, the amplifier circuit having at least one MOS transistor configured as a voltage controlled variable degeneration resistor, a comparator circuit that compares an operational voltage produced as a result of the predetermined reference voltage and a second predetermined reference voltage, wherein the comparator outputs a control voltage signal, a second amplifier circuit connected as a mirror of the first amplifier circuit, the second amplifier circuit having at least one MOS transistor configured as a voltage controlled variable degeneration resistor, wherein the control voltage signal is applied to a gate of the at least one MOS transistors in the first and second amplifier circuits to adjust the transconductance of the amplifiers.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art. Any and all such modifications, equivalents and alternatives are intended to fall within the spirit and scope of the present invention.

In general, the present invention is a technique for automatically controlling the gain of an amplifier by using a transistor as a voltage controlled variable degeneration resistor. The present invention may be advantageously adapted for use in either voltage-to-current amplifiers or voltage-to-voltage amplifiers, single-ended or differential designs, and may be implemented using CMOS or other process. The present invention will be described herein with reference to two conceptual schematic diagrams. However, as will be apparent to those skilled in the art, the present invention may be implemented using many different circuit configurations. The illustrative schematics are intended to be conceptual in nature, and are not to be interpreted as limiting the present invention to any specific circuit implementations.

Figure 1A:
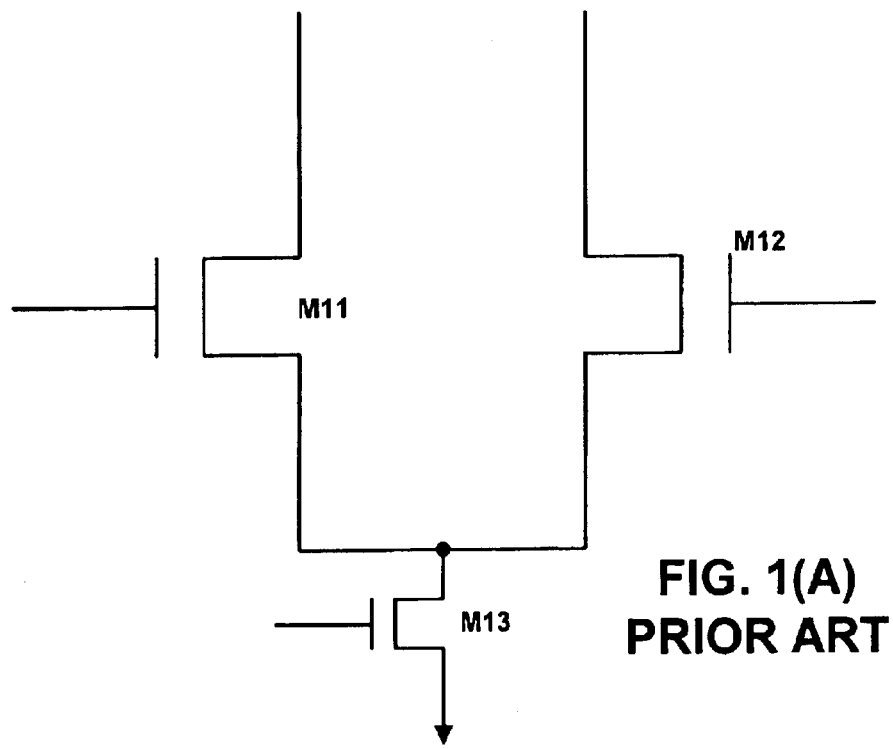
FIGS. 1(A) and 1(B) are schematics of typical prior art amplifier designs.
Figure 1B:
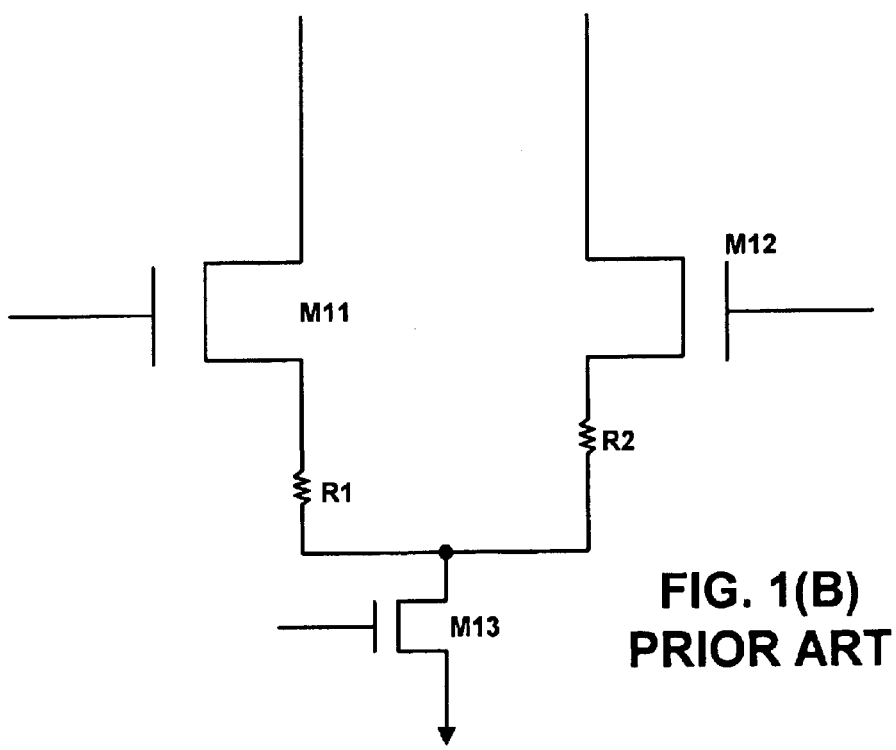

FIG. 1(A) illustrates a typical prior art gain stage that is subject to temperature and process variations. In other words, each amplifier will have a different gain, depending upon process variations that occur during manufacturing, and also depending upon the actual operating temperature of the device. One method to adjust the gain is shown in FIG. 1(B). Resistors $R_1$ and $R_2$ ("degeneration resistors") are added to the source side of the input transistors $M_{11}$ and $M_{12}$. The gain will be reduced depending upon the values of the resistors—the higher the resistor value, the lower the gain. Therefore by changing the resistance, the gain can be adjusted.

The present invention utilizes a MOS transistor operating in the linear region as a voltage-controlled degeneration resistor to adjust the effective transconductance of the input transistor though a replica biasing scheme. By adjusting the gate voltage of the NMOS transistor, the resistance can be adjusted. Using a feedback scheme, the gain is monitored, and any discrepancy is amplified to adjust the gain in the opposite direction by controlling the gate voltage of the transistors used for degeneration. As noted above, either differential or single-ended configurations will work. The figures illustrate examples of using an NMOS differential gain stage. Either voltage gain or voltage-to-current gain (transconductance) can be targeted.

Figure 2:
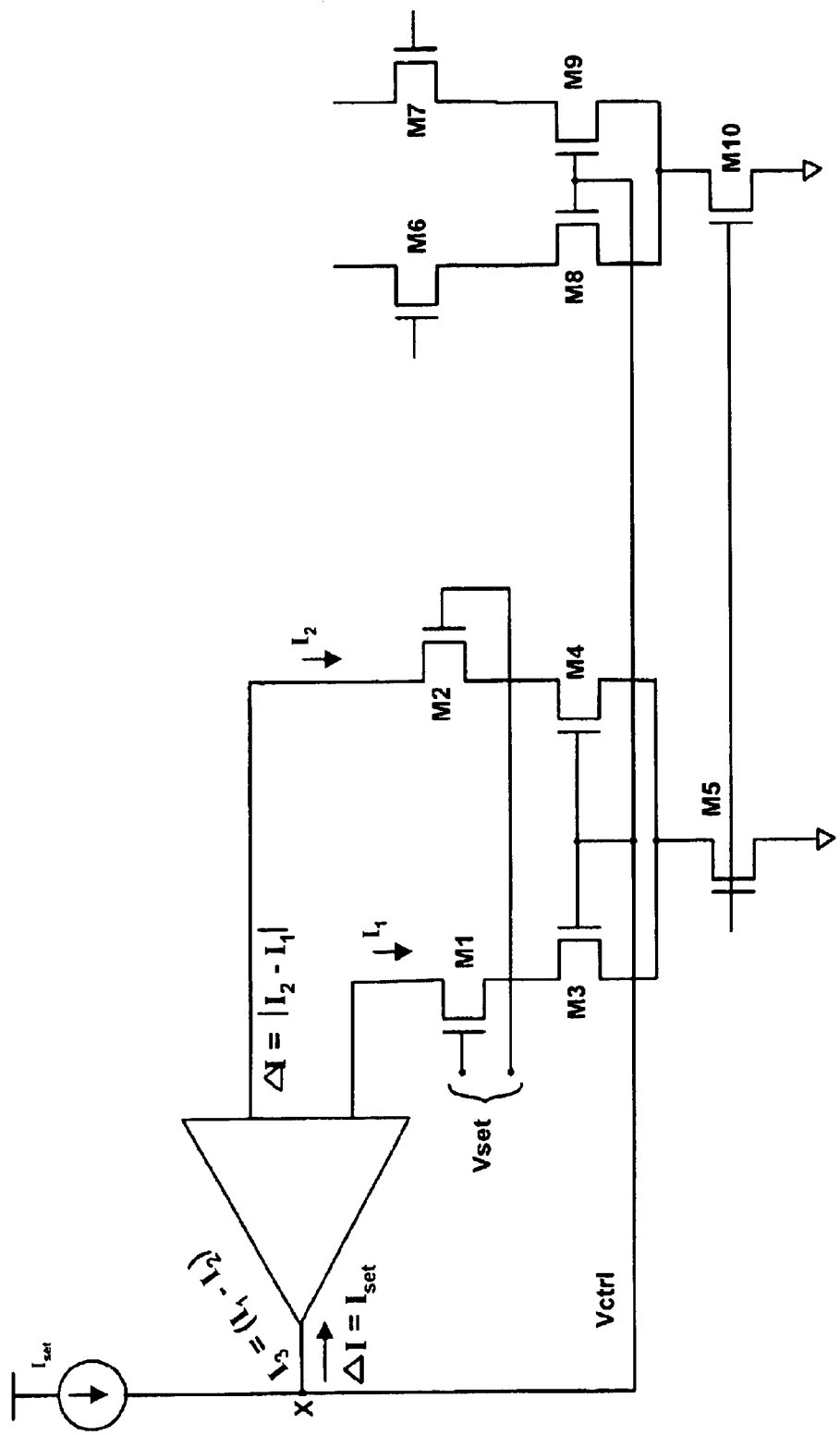
FIG. 2 is a schematic illustrating an embodiment of the present invention to minimize the variation of voltage-to-current gain (transconductance) of an amplifier.

FIG. 2 illustrates an example of a circuit having a voltage-to-current gain, also known as transconductance. A bias adjustment loop formed by transistors $M_1$–$M_5$ replicates the amplifier $M_6$–$M_{10}$ in order to set a bias voltage at the gates of $M_8$ and $M_9$. A preset differential voltage $V_{set}$ is applied at the gates of $M_1$ and $M_2$, which causes the drain currents $I_1$ and $I_2$ to be different. The effective transconductance $g_m$ is the ratio of the output current difference $I_1$–$I_2$ and the input voltage $V_{set}$, or $[g_m=(I_1-I_2)/V_{set}]$. Note that $g_m$ depends not only on the input devices $M_1$ and $M_2$, but also on the degeneration devices $M_3$ and $M_4$, such that $g_m=g_m0/(1+g_{m0}R_s)$, where $g_{m0}$ is the intrinsic transconductance of $M_1$, $M_2$ (without degeneration resistance) and $R_s$ is the degeneration resistance. Increasing the gate voltage of $M_3$ and $M_4$ will decrease the degeneration resistance $R_s$ thereby lowering $g_m$, and vice versa.

Block $A_1$ is a differential to single-ended current converter with high output impedance, such as a folded cascode stage. This block generally acts to subtract the two currents $I_1$ and $I_2$ and produce a current $I_3$ which equals $I_1$–$I_2$. The effective transconductance is $g_m=I_3/V_{set}$. The current $I_3$, with the preset current $I_{set}$, sets the control voltage $V_{ctrl}$ at node X, which controls the gates of the degeneration transistors $M_3$ and $M_4$. Due to the high output impedance at node X, a small difference in $I_{set}$ and $I_3$ will change $V_{ctrl}$ significantly. Specifically, if $I_3$ is higher than $I_{set}$, then node X is pulled down; hence $V_{ctrl}$ will be lowered and the resistance of the degeneration transistors $M_3$ and $M_4$ will be adjusted higher. The effective transconductance of $M_1$, $M_2$, will be lowered, therefore $I_3$ will be decreased. A similar analysis applies to the case when $I_3$ is lower than $I_{set}$. When the control loop is stable, $I_3$ equals $I_{set}$, and the effective transconductance of $M_3$, $M_4$ equals the preset value of $I_{set}/V_{set}$. The voltage $V_{ctrl}$ is also applied to the gates of the degeneration transistors $M_8$ and $M_9$ in the main amplifier, thus the transconductance of the main amplifier is controlled to equal the preset value. If the amplifier $M_6$–$M_{10}$ is a multiple (in size) versus amplifier $M_1$–$M_5$, then the transconductance is a multiple of the preset value, regardless of variations in process and temperature change, at least to the first order.

Even though the implementation of FIG. 2 requires additional circuitry, it does not require much additional silicon area because the two amplifiers could be ratio'd. For example, in one implementation the main amplifier is 32 times larger than the replica, which saves both silicon area and current consumption.

Figure 3:
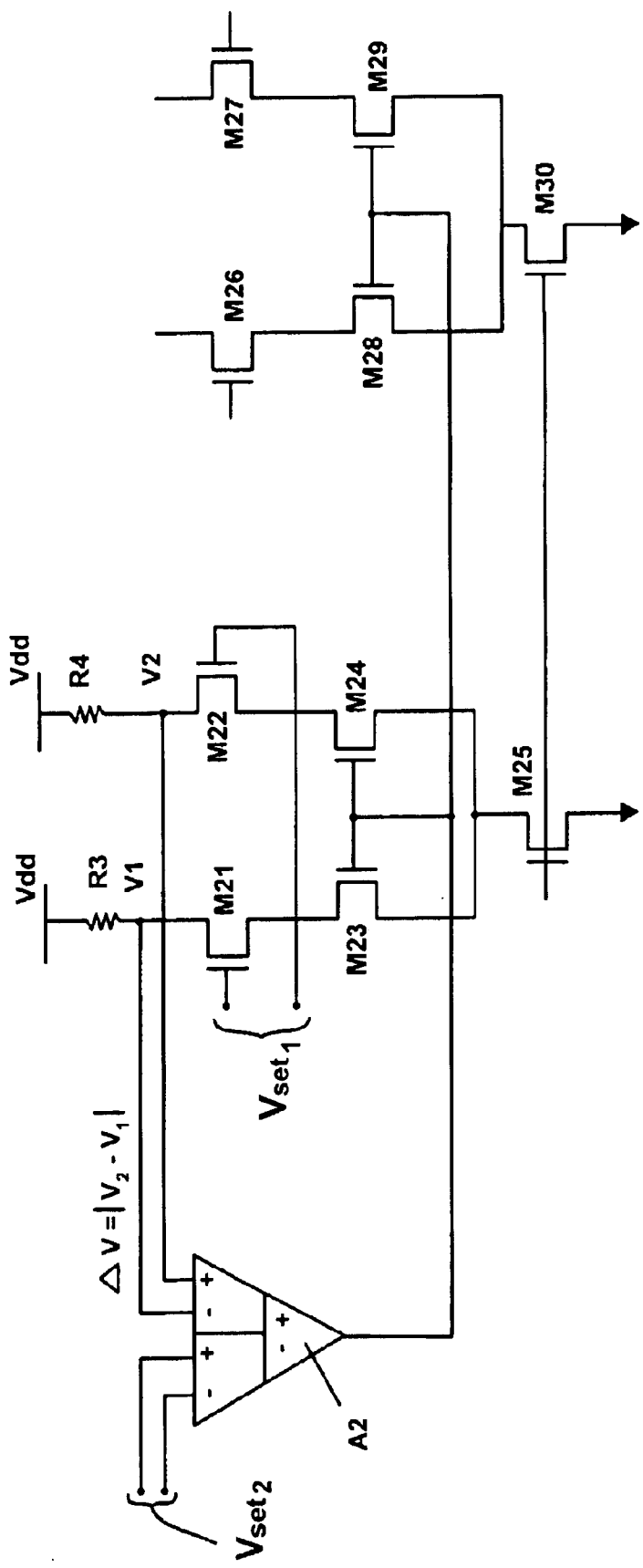
FIG. 3 is a schematic illustrating an embodiment of the present invention to minimize the variation of voltage-to-voltage gain of an amplifier.

FIG. 3 is a conceptual schematic of the voltage-to-voltage gain implementation of the present invention. In this type of circuit, the voltage gain is $A_v=(V_2-V_1)V_{set1}$. A bias adjustment loop formed by transistors $M_{21}$–$M_{25}$ mirrors the main amplifier $M_{26}$–$M_{30}$ in order to set the biasing voltage at the gates of $M_{28}$ and $M_{29}$.

In further detail, a differential voltage $V_{set1}$ is applied to the gates of transistors $M_{21}$ and $M_{22}$ which generates a difference in the output voltages $V_1$ and $V_2$. Amplifier $A_2$ is an amplifier that amplifies the difference between two differential input voltages. In this case, one differential input is the difference between $V_1$ and $V_2$, and the second input is a preset differential voltage $V_{set2}$. The output of $A_2$ is used as the control voltage, $V_{ctrl}$, which is applied to the gates of $M_{23}$ and $M_{24}$, to adjust the effective resistance of each transistor. Once the loop settles, the differential $V_{set2}$ voltage equals the difference between $V_1$ and $V_2$. As a result, the voltage gain $A_v$ equals the preset value $V_{set2}/V_{set1}$. As in FIG. 2, the control voltage signal $V_{ctrl}$ is also applied to the gates of the degeneration transistors $M_{28}$ and $M_{29}$ in the main amplifier thereby automatically adjusting the gain. Thus, the fluctuations in gain caused by variations in process and temperature can be greatly reduced.

As described herein, the present invention utilizes a transistor as a voltage controlled variable degeneration resistor to adjust the gain of an amplifier circuit automatically. One benefit of this technique is that, since the bias current is constant, the transistors operate in the correct region (i.e. the transistors are not biased out of the operating region). Additionally, the control mechanism is well-bounded—i.e. at the lower end, the gain can always be reduced by lowering the control voltage. The upper limit of the $V_{ctrl}$ is bounded by the supply voltage. In the case where the preset gain is too high to achieve, the amplifier will still work with $V_{ctrl}$ set as high as the supply voltage. In the prior art gain adjustment designs that adjust the biasing current, the current may potentially be increased such that the amplifier is biased beyond the normal operation region.

One application of the present invention is for a signal strength detection circuit. By setting the gain of the amplifier to a known value, and measuring the output signal, the strength of the input signal can be determined.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A gain adjustment circuit comprising:

a first amplifier circuit having a first reference signal applied thereto, the first reference signal producing an operation signal from the first amplifier circuit;

a signal comparator that receives the operation signal and a second reference signal and outputs an adjustment signal that is proportional to a difference between the operation signal and the second reference signal; and a MOS transistor in the first amplifier circuit configured as a voltage controlled degeneration resistor;

wherein the adjustment signal is applied to a gate of the MOS transistor, thereby adjusting a gain of the first amplifier circuit.

2. The circuit of claim 1, further comprising a second amplifier circuit connected as a replica circuit to the first amplifier circuit, such that the adjustment signal is applied to a gate of a second MOS transistor in the second amplifier circuit.

3. A method for automatically adjusting an amplifier circuit gain, the method comprising:

applying a first reference signal to a first amplifier circuit, thereby producing an operation signal;

comparing the operation signal with a second reference signal and outputting an adjustment signal that is proportional to a difference between the operation signal and the second reference signal; and applying the adjustment signal to a gate of a MOS transistor, wherein the MOS transistor is configured as a voltage controlled variable degeneration resistor to adjust the gain of the amplifier in response to the adjustment signal applied to the gate.

4. The method of claim 3, further comprising:

mirroring the operation of the first amplifier with a second amplifier, wherein the adjustment signal is applied to a gate of a second MOS transistor in the second amplifier in order to adjust the gain of the second amplifier.

5. A voltage-to-current amplifier circuit with automatic tranconductance adjustment, the circuit comprising:

a first amplifier circuit having a first predetermined reference voltage applied to the amplifier, the amplifier circuit having at least one MOS transistor configured as a voltage controlled variable degeneration resistor;

a reference current source connected to a control node;

a converter circuit having an output connected to the control node and an input connected to the first amplifier circuit, wherein the converter circuit detects an operational current produced by the amplifier in response to the first predetermined reference voltage, and outputs an adjustment current, based on the operational current, to the control node;

a second amplifier circuit connected as a replica of the first amplifier, the second amplifier circuit having at least one MOS transistor configured as a voltage controlled variable degeneration resistor;

wherein a control voltage at the control node, set by the reference current and the adjustment current, is applied to a gate of the at least one MOS transistors in the first and second amplifier circuits to adjust the transconductance of the amplifiers.

6. The circuit of claim 5, wherein the first and second amplifier circuits are differential amplifiers with each branch of the differential amplifiers having a voltage controlled variable degeneration MOS transistor connected to a source side of an amplifier transistor, and wherein the control voltage is applied to a gate of each degeneration MOS transistor in each branch of the differential amplifiers.

7. The circuit of claim 6, wherein the converter circuit comprises a differential single-ended current converter comprising a folded-cascode stage.

8. A method for automatically adjusting a voltage-to-current amplifier circuit gain, the method comprising:

setting a level of a first reference voltage that establishes an operational current in an amplifier circuit;

setting a level of a reference current at a control node;

detecting the operational current;

outputting an adjustment current at the control node, based on the detected operational current; and applying a control voltage at the control node to a gate of a MOS transistor, wherein the MOS transistor is configured as a voltage controlled variable degeneration resistor to adjust the gain of the amplifier in response to the control voltage applied to the gate.

9. The method of claim 8, further comprising:

replicating the operation of the amplifier with a second amplifier circuit, wherein the control voltage is applied to a gate of a second MOS transistor in the second amplifier circuit in order to adjust the gain of the second amplifier.

10. The method of claim 9, wherein the amplifier circuit and the second amplifier circuit comprise differential amplifiers, and the first reference voltage is a differential voltage.

11. A voltage-to-voltage amplifier circuit with automatic gain adjustment, the circuit comprising:

a first amplifier circuit having a first predetermined reference voltage applied to the amplifier, the amplifier circuit having at least one MOS transistor configured as a voltage controlled variable degeneration resistor;

a comparator circuit that compares an operational voltage produced as a result of the predetermined reference voltage and a second predetermined reference voltage, wherein the comparator outputs a control voltage signal;

a second amplifier circuit connected as a mirror of the first amplifier circuit, the second amplifier circuit having at least one MOS transistor configured as a voltage controlled variable degeneration resistor;

wherein the control voltage signal is applied to a gate of the at least one MOS transistors in the first and second amplifier circuits to adjust the transconductance of the amplifiers.

12. The circuit of claim 11, wherein the first and second amplifier circuits are differential amplifiers with each branch of the differential amplifiers having a voltage controlled variable degeneration MOS transistor connected to a source side of an amplifier transistor, and wherein the control voltage is applied to a gate of each degeneration MOS transistor in each branch of the differential amplifiers.

13. The circuit of claim 12, wherein the first and second predetermined voltage signals comprise differential voltage signals.

14. The circuit of claim 13, wherein the comparator circuit comprises an amplifier to compare and amplifier a difference between two differential voltage signals.

15. A method for automatically adjusting a voltage-to-voltage amplifier circuit gain, the method comprising:

setting a level of a first reference voltage that establishes an operational voltage in the amplifier circuit;

setting a level of a second reference voltage;

comparing the second reference voltage with the operational voltage and generating a control voltage based upon a difference between the second reference voltage and the operational voltage; and applying the control voltage to a gate of a MOS transistor, wherein the MOS transistor is configured as a voltage controlled variable degeneration resistor to adjust the gain of the amplifier in response to the control signal applied to the gate.

16. The method of claim 15, further comprising:

mirroring the operation of the amplifier with a second amplifier circuit, wherein the control voltage signal is applied to a gate of a second MOS transistor in the second amplifier circuit in order to adjust the gain of the second amplifier.

17. The method of claim 16, wherein the amplifier circuit and the second amplifier circuit comprise differential amplifiers, and the first reference voltage and the second reference voltage are differential voltages.

18. An automatic gain control circuit for an amplifier, wherein the improvement comprises configuring a MOS transistor to operate as a voltage controlled variable degeneration resistor in a first amplifier circuit, such that a control signal applied to gate of the transistor adjusts the gain of the amplifier, and wherein a second amplifier circuit is connected as a replica circuit to the first amplifier circuit, such that the control signal is applied to a gate of a second MOS transistor in the second amplifier circuit.

* * * * *